United States Patent [19]
Sezginer

[11] Patent Number: 5,486,761
[45] Date of Patent: * Jan. 23, 1996

[54] NUCLEAR MAGNETIC RESONANCE MEASURING APPARATUS

[75] Inventor: Abdurrahman Sezginer, Brookfield, Conn.

[73] Assignee: Schlumberger Technology Corporation, New York, N.Y.

[*] Notice: The portion of the term of this patent subsequent to Dec. 27, 2011, has been disclaimed.

[21] Appl. No.: 259,999

[22] Filed: Jun. 15, 1994

Related U.S. Application Data

[63] Continuation of Ser. No. 41,643, Apr. 1, 1993, Pat. No. 5,376,884.

[51] Int. Cl.$^6$ .................................................. G01V 3/00
[52] U.S. Cl. ............................................. 324/303; 324/318
[58] Field of Search ..................................... 324/303, 300, 324/306, 318, 319, 322

[56] References Cited

U.S. PATENT DOCUMENTS

| | | | |
|---|---|---|---|
| 3,179,878 | 4/1965 | Schwede | 324/0.5 |
| 3,667,035 | 5/1972 | Slichter | 324/0.5 R |
| 4,350,955 | 9/1982 | Jackson et al. | 324/303 |
| 4,710,713 | 12/1987 | Strikman et al. | 324/303 |
| 4,714,881 | 12/1987 | Givens | 324/303 |
| 4,717,876 | 1/1988 | Masi et al. | 324/303 |
| 4,717,877 | 1/1988 | Taicher et al. | 324/303 |
| 4,717,878 | 1/1988 | Thaicher et al. | 324/303 |
| 4,933,638 | 6/1990 | Kenyon et al. | 324/303 |
| 5,023,551 | 6/1991 | Kleinberg et al. | 324/303 |
| 5,055,787 | 10/1991 | Kleinberg et al. | 324/303 |
| 5,055,788 | 10/1991 | Kleinberg et al. | 324/303 |
| 5,153,514 | 10/1992 | Griffin et al. | 324/303 |
| 5,376,884 | 12/1994 | Sezginer | 324/303 |

FOREIGN PATENT DOCUMENTS 2141236   12/1984   United Kingdom.

OTHER PUBLICATIONS

R. L. Kleinberg, A. Sezginer, D. D. Griffin and M. Fukuhara, "Novel NMR Apparatus for Investigating an External Sample", Journal Of Magnetic Resonance 97, 466–485 (1992).

Richard K. Cooper and Jasper A. Jackson, "Remote (Inside–Out) NMR. I. Remote Production of a Region of Homogeneous Magnetic Field", Journal of Magnetic Resonance 41, 400–405 (1980).

W. E. Kenyon, J. J. Howard, A. Sezginer, C. Straley, A. Matteson and K. Horkowitz, R. Ehrlich, "Pore–size Distribution and NMR in Microporous Cherty Sandstones", Trans, SPWLA, Paper LL, 1989.

W. E. Kenyon, P. I. Day, C. Straley and J. F. Willemsen, "Compact And Consistent Representation Of Rock NMR Data For Permeability Extimation", SPE 15643.

M. N. Miller, Z. Paltiel, M. E. Gillen, J. Granot, and J. C. Bouton, "Spin Echo Magnetic Resonance Logging: Porosity and Free Fluid Index Determination", SPE 20561.

*Primary Examiner*—Louis M. Arana
*Attorney, Agent, or Firm*—Martin M. Novack; Leonard W. Pojunas

[57]   ABSTRACT

The disclosure invention is directed to a nuclear magnetic resonance measurement apparatus that can be utilized in a logging device which operates generally centrally in a borehole, and has a generally circumferential region of investigation, but which permits usage of relatively powerful permanent magnets, such as rare-earth magnets, that are not permeable to the RF magnetic field. This is achieved by employing side-by-side spaced apart elongated magnets, and an RF current loop in the region between the magnets. In a disclosed embodiment, the magnets are each in the shape of a segment of a cylinder, and the respective axes of elongation of the magnets are parallel. The magnets have respective casings with electrically conductive surfaces, and the RF current loop includes at least a portion of the conductive surfaces of the magnet casings.

18 Claims, 7 Drawing Sheets

NUCLEAR MAGNETIC RESONANCE MEASURING APPARATUS

This is a continuation of U.S. application Ser No. 08/041,643 filed Apr. 1, 1993, now U.S. Pat. No. 5,376,884.

FIELD OF THE INVENTION

This invention relates to determination of nuclear magnetic resonance properties of substances, and has particular application to determination of nuclear magnetic resonance properties of earth formations surrounding a borehole.

BACKGROUND OF THE INVENTION

There have been various prior approaches suggested and/or implemented for measuring nuclear magnetic resonance ("NMR") properties of earth formations surrounding a borehole to obtain evidence of the substances present.

It is well recognized that any particles of a formation having non-zero magnetic spin, for example protons, have a tendency to align with a magnetic field imposed on the formation. Such a magnetic field may be naturally generated, as is the case for the earth's magnetic field, $B_E$. When a second magnetic field $B_1$, transverse to $B_E$, is imposed on the protons by a logging tool electromagnet, the protons will align with the vector sum of $B_E$ and $B_1$ after a sufficient polarization time has passed. If the polarizing field $B_1$ is then switched off, the protons will tend to precess about the $B_E$ vector with a characteristic Larmor frequency $\omega_L$ which depends on the strength of the earth's field $B_E$ and the gyromagnetic constant of the particle. Hydrogen nuclei precessing about a magnetic field $B_E$ of 0.5 gauss have a characteristic frequency of approximately 2 kHz. If a population of hydrogen nuclei were made to precess in phase, the combined magnetic fields of the protons can generate a detectable oscillating voltage in a receiver coil. Hydrogen nuclei (protons) of water and hydrocarbons occurring in rock pores produce NMR signals distinct from signals induced in other rock constituents.

A further NMR approach employs a locally generated static magnetic field, $B_0$, which may be produced by one or more permanent magnets. Nuclear spins align with the applied field $B_0$ with a time constant of $T_1$. The angle between the nuclear magnetization and the applied field can be changed by applying an RF magnetic field $B_1$ perpendicular to the static field $B_0$. The frequency of the RF field must be (4.258 kHz/Gauss)·$B_0$. The angle of nutation (tilt) obtained between the nuclear magnetization and the static field is proportional to the product of $B_1$ and the duration of the RF pulse. At the end of the RF pulse, the nuclear spins precess around the static field $B_0$ at the Larmor frequency (4.258 kHz/Gauss)·$B_0$. The rotating component of the nuclear magnetization decays with a time constant $T_2$ which is less than $T_1$. Various measurements, known in the art, can be made to determine parameters of these phenomena, from which earth formation characteristics can be inferred.

For the type of operation just described, it is desirable to have the RF field, $B_1$, perpendicular to the static field, $B_0$, to have the static field, $B_0$, as large as possible, and to have a static field intensity variation, as a function of position, be as small as possible in the measurement region so that a larger "resonant volume" will contribute to the measurements.

One prior art approach is described, for example, in U.S. Pat. No. 5,055,788, which discloses a nuclear magnetic resonance logging device having permanent magnets and an RF trough antenna mounted in a pad or skid that contacts the borehole wall. Measurements are made on the side of the borehole wall that the pad or skid faces. Relatively powerful rare-earth magnets can be used, and are arranged to obtain a static and substantially homogeneous magnetic field in a given volume of the formation directed to one side of the body. The trough antenna that generates the RF field is electromagnetically shielded and is directed toward the given volume of formation.

Another approach, described, for example, in U.S. Pat. No. 4,710,713, uses one or more cylindrically arranged permanent magnets in a centralized tool with a generally circumferential region of investigation around the borehole. An RF coil is wound around the outside of the magnets, and produces an RF field that is indicated as being perpendicular to the static field produced by the permanent magnets. A limitation of this centralized approach is that the RF magnetic field produced by the coil needs to pass through the magnet material, and the '713 Patent indicates that it is essential that the magnet material be non-conductive, such as a ferrite.

It is among the objects of the present invention to provide a nuclear magnetic resonance measuring apparatus that has a generally circumferential region of investigation, and overcomes limitations of prior art approaches.

SUMMARY OF THE INVENTION

The present invention is directed to a nuclear magnetic resonance measurement apparatus that can be utilized in a logging device which operates generally centrally in a borehole, and has a generally circumferential region of investigation, but which permits usage of relatively powerful permanent magnets, such as rare-earth magnets, that are not permeable to the RF magnetic field. This is achieved by employing side-by-side spaced apart elongated magnets, and an RF current loop (or plurality of loops, as in a coil) in the region between the magnets.

In accordance with an embodiment of the invention, there is provided an apparatus for measuring a nuclear magnetic resonance property of formations surrounding an earth borehole. A logging device, moveable through the borehole, is provided. First and second elongated magnets, preferably rare-earth permanent magnets, are disposed in the device in side-by-side spaced-apart arrangement. An RF current loop is disposed in the region between the magnets. Means are provided for coupling RF energy to the RF current loop. Means are also provided for detecting RF signals induced in the RF current loop.

In a disclosed embodiment of the invention, the magnets are each in the shape of a segment of a cylinder, and the respective axes of elongation of the magnets are parallel. In this embodiment, the magnets have respective casings with electrically conductive surfaces, and the RF current loop includes at least a portion of the conductive surfaces of the magnet casings. Also in this embodiment, the RF current loop includes a conductor coupled between conductive surfaces of respective magnet casing surfaces, and further includes at least one capacitor coupled between conductive surfaces of respective magnet casing surfaces.

In accordance with a further feature of the invention the permanent magnets extend longitudinally beyond both longitudinal extremes of the RF current loop. This helps ensure that the static magnetic field is relatively constant with respect to the longitudinal (generally, vertical) position in the region of investigation, and also reduces or eliminates any spurious NMR signal contribution from the borehole fluid beyond the longitudinal ends of the magnets.

DETAILED DESCRIPTION

Figure 1:
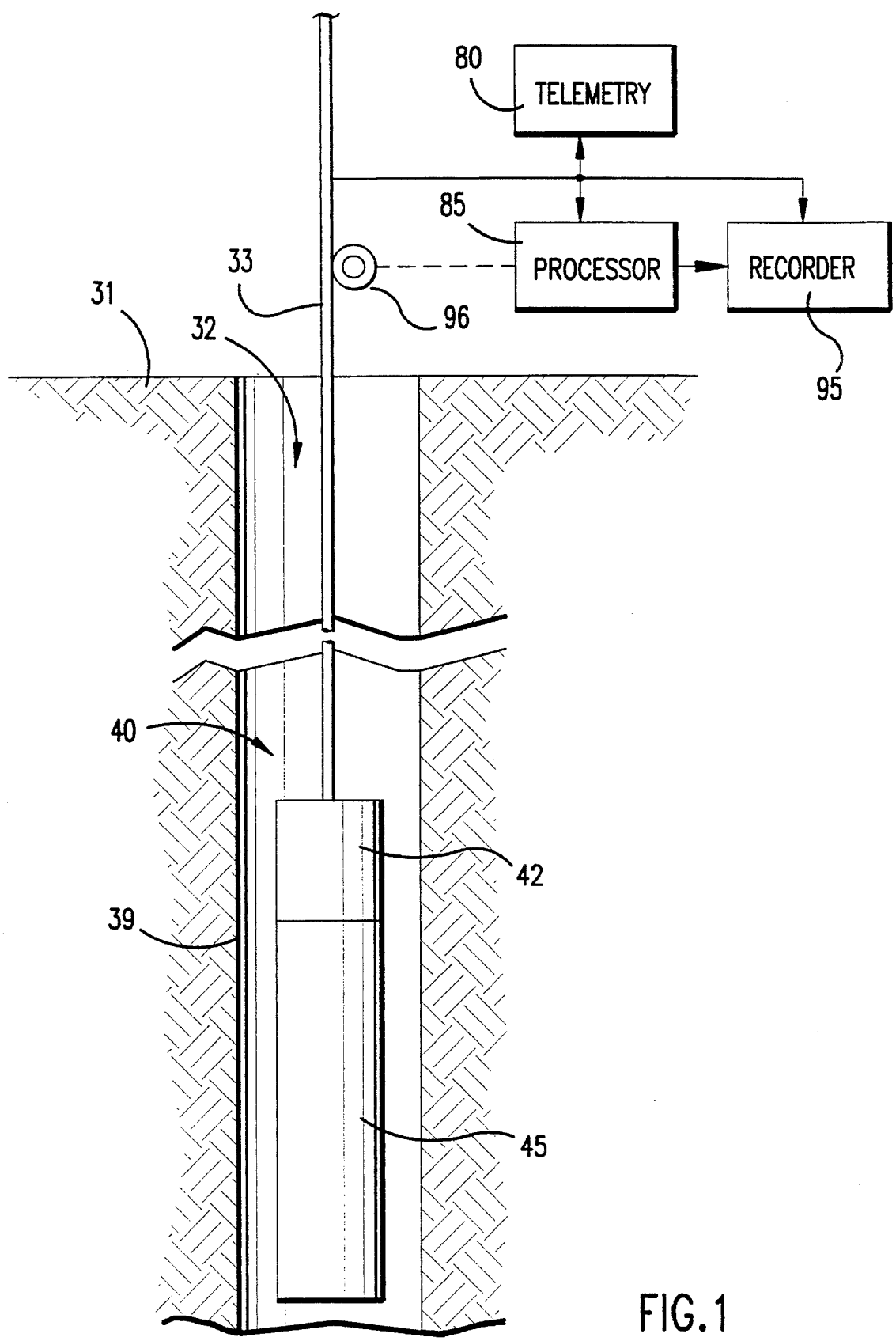
FIG. 1 is a diagram, partially in block form, of an apparatus in accordance with an embodiment of the invention.

Referring to FIG. 1, there is shown an apparatus in accordance with an embodiment of the invention for investigating subsurface formations 31 traversed by a borehole 32, which can be used in practicing embodiments of the invention. The borehole 32 is typically filed with a drilling fluid or mud which contains finely divided solids in suspension and a mudcake 39 is shown on the walls of the borehole.

An investigating apparatus or logging device is suspended in the borehole 32 on an armored cable 33, the length of which substantially determines the relative depth of the device 30. The cable length is controlled by suitable means at the surface such as a drum and winch mechanism (not shown). In the illustrated embodiment, the logging device comprises an elongated cylindrical sonde 40, which can be provided with centralizing arms (not shown). The top portion thereof, 42, can contain electronics and telemetry equipment. Measurement signals can be processed and/or stored downhole, using a downhole processor, but it will be understood that some or all signals could be transmitted uphole for processing and/or storage. Electronic signals indicative of the information obtained by the logging device can be transmitted through the cable 33 to uphole telemetry equipment 80, uphole processor 85, and recorder 95. Depth information to the recorder 95 and processor 85 can be provided from a rotating wheel 96 that is coupled to the cable 33. The processor 85 will typically include associated memory, timing, input/output, display, and printing functions, none of which are separately shown. Although the logging device is shown as a single body, it may alternatively comprise separate components, or may be a tool that is combinable with other logging tools. Also, while a wireline is illustrated, alternative forms of physical support and communicating link can be used, for example in a measurement while drilling system.

Figure 2:
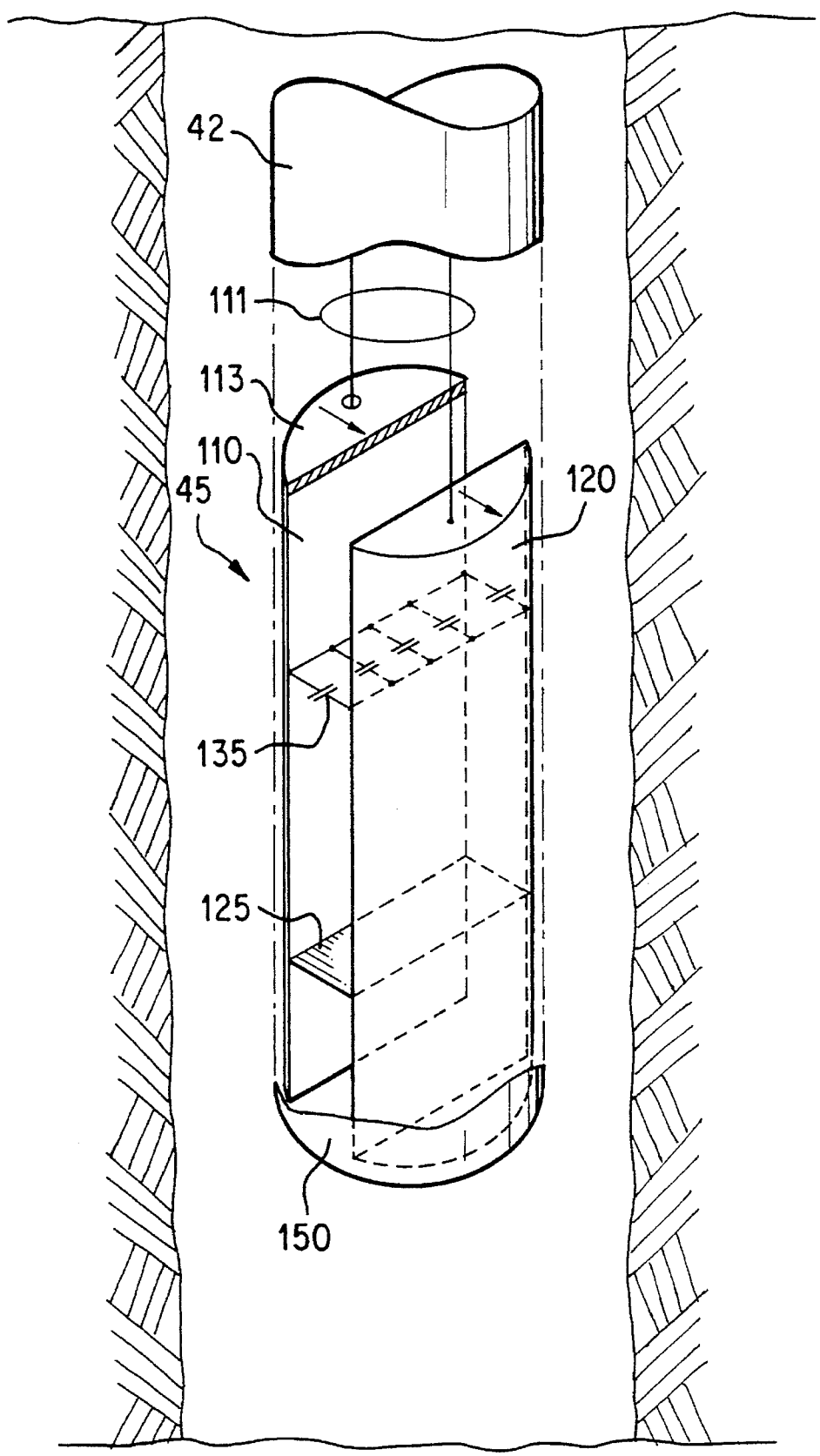
FIG. 2 is a cross-sectional partially broken-away and schematic view of the logging device of the FIG. 1 apparatus.

The lower portion of the logging device 40, represented at 45 in FIG. 1, is shown, partially schematically, in FIG. 2. Elongated permanent magnets 110 and 120, are mounted in side-by-side spaced apart arrangement within a housing 150, shown broken away in FIG. 2. The longitudinal axes of the magnets are parallel and, in the present embodiment, are also parallel to the longitudinal axis of the sonde 40, which will generally be approximately parallel to the borehole axis. In the present embodiment, and as described further hereinbelow, the magnetic material of the permanent magnets is part of a magnet assembly that includes a casing with a surface having one or more layers. The magnets are preferably rare earth magnets, such as Sm-Co magnets, which are relatively powerful permanent magnets, but which are conductive and are not permeable to the RF magnetic field. The rare earth magnetic material is relatively brittle, and is difficult to make in large pieces, so it is conventionally made by packaging a number of small pieces of the rare earth magnetic material in a relatively strong magnet casing. In the present embodiment the magnet casing material is preferably a non-magnetic metal such as titanium or monel. In the illustrated embodiment, each of the magnet casings is in the shape of a segment of an elongated cylinder. The magnetization directions of the magnets, represented by the arrows in the Figure, are aligned, and are perpendicular to the longitudinal axis of the magnets and the sonde. The magnetization directions are also perpendicular to the radial direction of the gap between the magnets.

Figure 3:
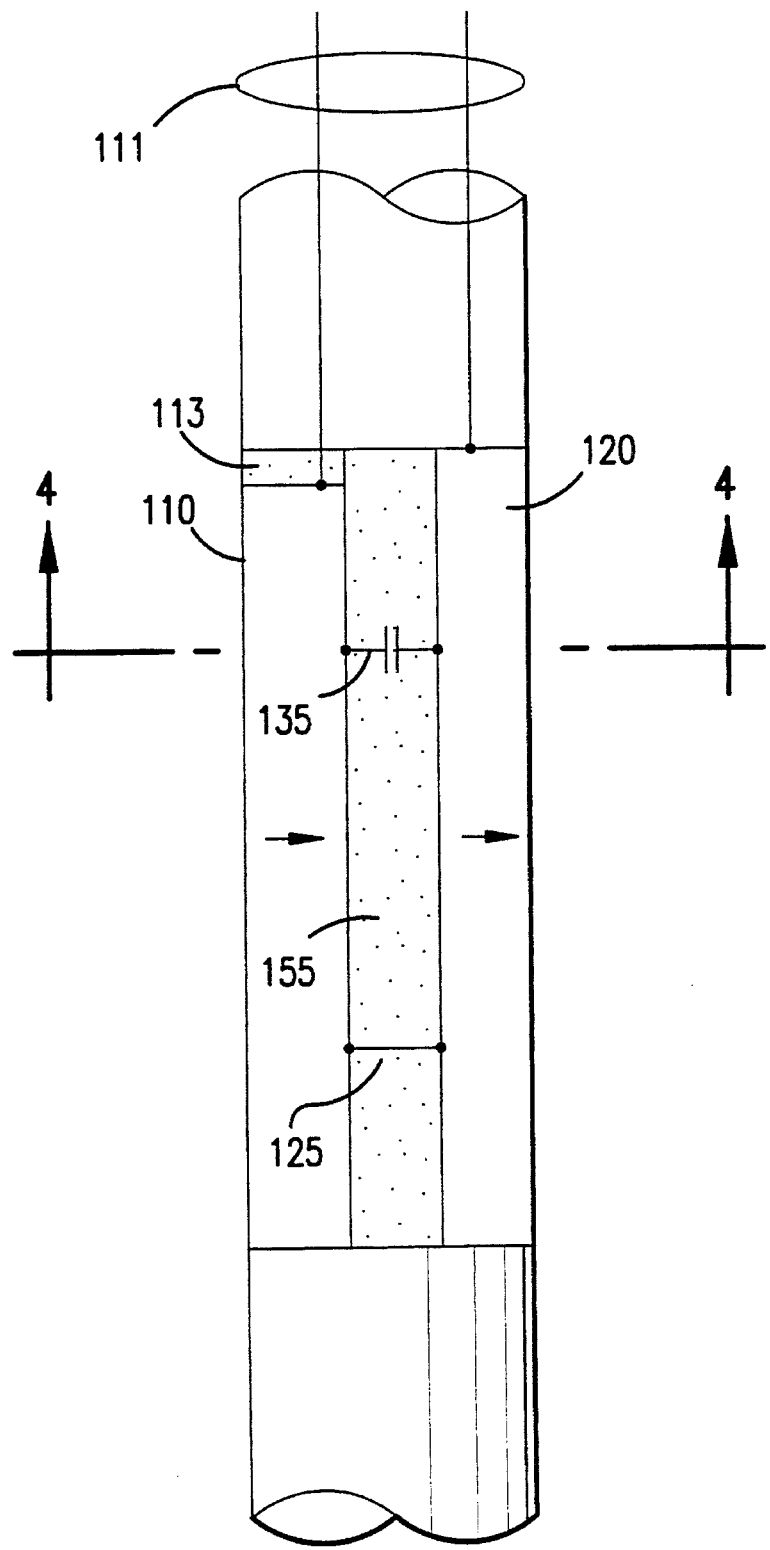
FIG. 3 is another cross-sectional, partially broken away and schematic view of the FIG. 1 apparatus.
Figure 4:
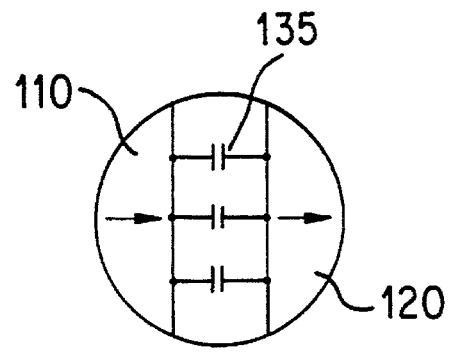
FIG. 4 is a cross-sectional view as taken through a section defined by arrows 4—4 of FIG. 3.

In a form of the invention, the magnet casings constitute part of an RF current loop that is used to transmit and receive the RF magnetic field. In the embodiment illustrated in FIG. 2 (and with reference now also to FIGS. 3 and 4) a conductor 125, for example a copper cable, plate, or wires, is coupled across the magnet casings, preferably at a longitudinal position below the longitudinal centers of the magnets, and above the lower ends of the magnets. At least one capacitor, represented in FIGS. 2–4 by capacitors 135, is coupled across the magnet casings, preferably at a longitudinal position above the longitudinal centers of the magnet casings, and below the top ends of the magnet casings. The capacitor(s) 135, which function as parallel resonating tuning capacitors, in conjunction with the RF short 125 and the magnet casings, provide a resonant RF loop in the longitudinal central region of the magnet casings. The magnet casings (and the magnets therein) extend substantially above and below the resonant region of the RF loop. A ferrite core 155 (not shown in FIG. 2, for ease of illustration), which may either be a ferrite permanent magnet or an unmagnetized ferrite with high magnetic permeability, but must be permeable to the RF magnetic field, can be provided in the region between the magnets, as shown in FIGS. 3 and 4. Conductors from the RF transmitter/receiver, represented at 111, are coupled to the magnet casings, as shown in FIGS. 2 and 3, and with the lefthand conductor being coupled to magnet casing 110 through insulating material 113. The magnet casings can, for example, be bolted together, using a lower bolt (not shown) below conductor 125, and an upper bolt, such as an insulated bolt (not shown), above capacitor(s) 135, to form a sturdy and rugged structure.

Figure 5:
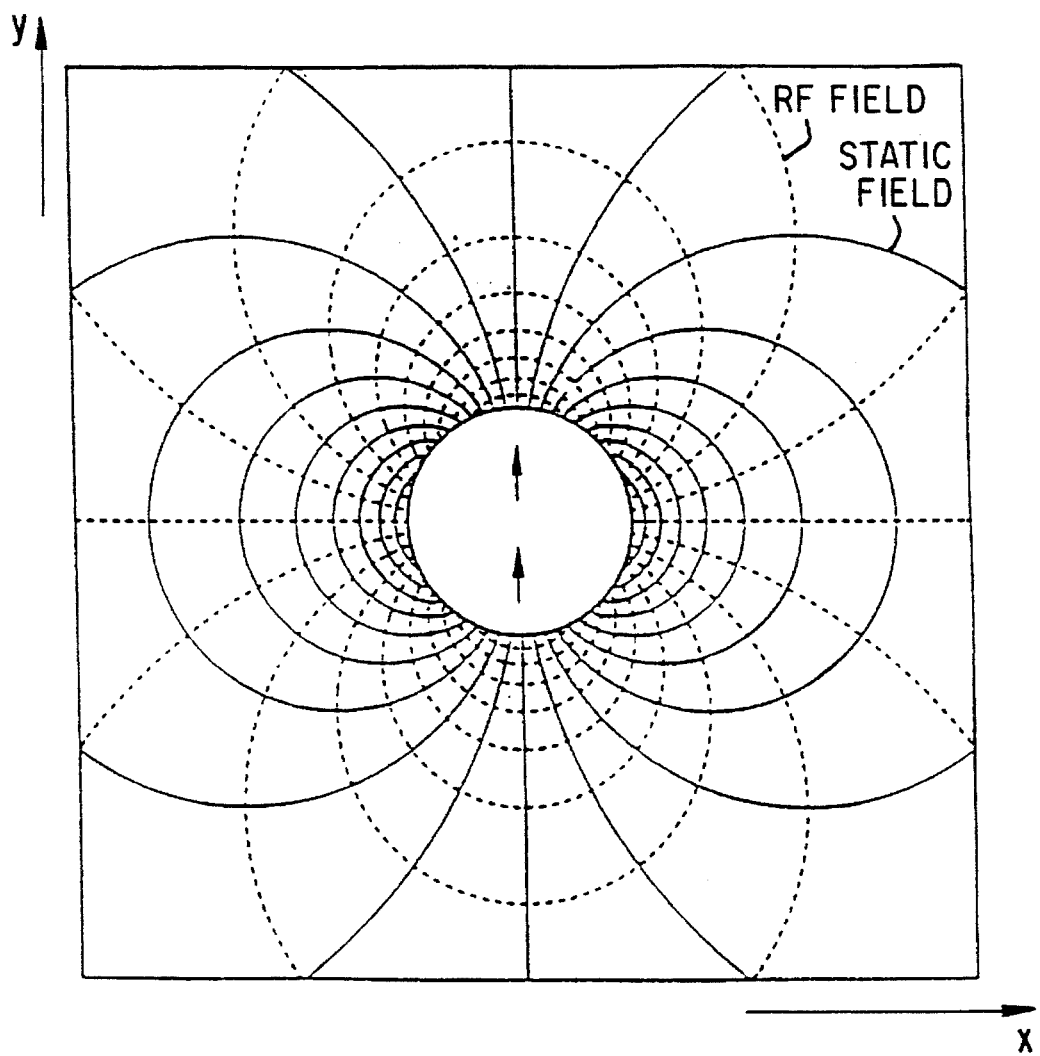
FIG. 5 is a diagram showing two z-independent dipolar fields that are everywhere orthogonal.
Figure 6:
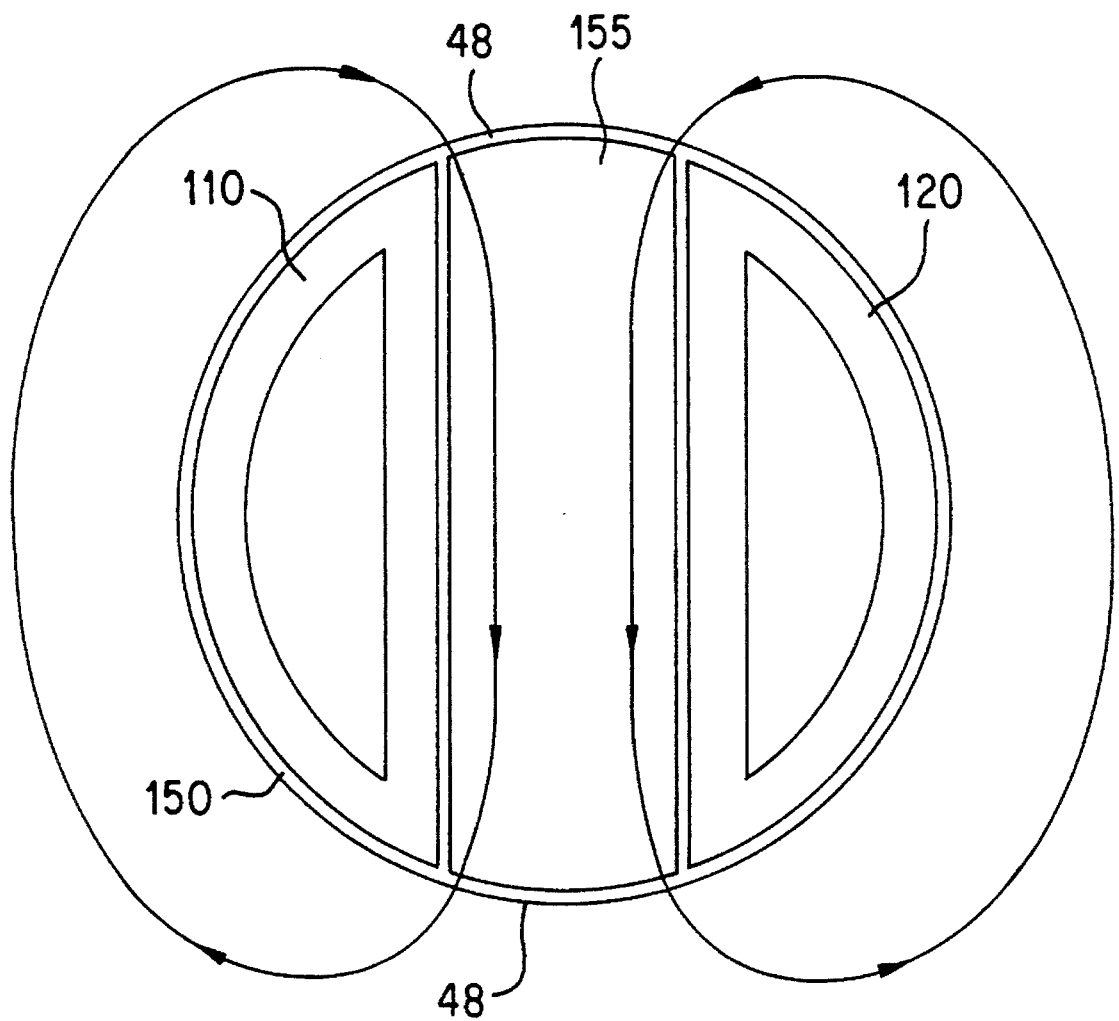
FIG. 6 is a simplified top view of the logging device of the FIG. 1 embodiment, illustrating representative field lines of the RF magnetic field.
Figure 7:
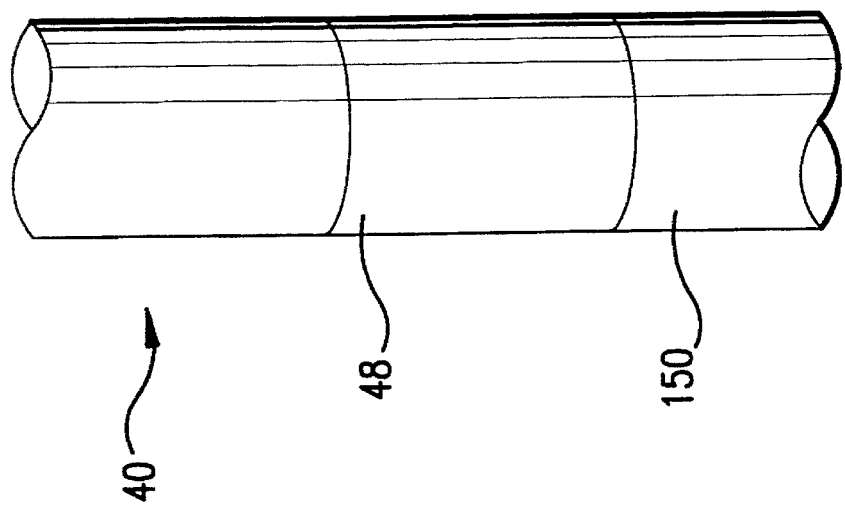
FIG. 7 illustrates a partially broken-away view of the exterior of an embodiment of the logging device of FIG. 1.

FIG. 5 illustrates the field patterns of two z-independent [z being the longitudinal (or vertical) direction] dipolar fields, represented in solid and dashed line, respectively, that are orthogonal to each other at all points. These patterns are approximately representative of the static and RF fields, respectively, in the embodiment of FIGS. 2–4. For example, with the permanent magnet magnetization direction in FIG. 5 being represented by the arrows, the solid line field pattern approximately represents the static field pattern, and the dashed line field pattern approximately represents the RF field. In the illustrated embodiment, the RF field exits the sonde at one side of the ferrite 155 that is not blocked by the magnet cases, circulates around the sonde, and enters the sonde at the opposite side of the ferrite 155. This is illustrated in FIG. 6, which shows the magnets and magnet cases 110, 120, the ferrite block 155, and representative RF field lines (with arrows). The region of the sonde adjacent the gap between the magnet cases can be covered with a non-metallic material, 48, that will not inhibit the RF field, for example, nylon. FIG. 7 shows a configuration which employs a cylindrical nylon shell 48 that covers the region of the RF loop.

As above indicated, the magnets are substantially longer than the longitudinal extent of the RF loop, and extend substantially above and below the RF loop (defined by capacitors 135 and RF short 125, in this embodiment). Preferably, the length of each extension, or "guard section", is at least equal to the radial depth of investigation of the logging device. The upper and lower "guard sections" of the magnets are useful in providing a longer effective source of static field in the z-direction, which results in a relatively z-invariant static field in the device's investigation region around the RF loop. An important advantage of the guard sections is in reducing or eliminating any spurious NMR signal contribution from the borehole fluid beyond the longitudinal ends of the magnets. The resonant region in the borehole must be sufficiently far away from the RF loop so that no significant NMR signal is received from the borehole fluid which generally has a higher concentration of hydrogen nuclei compared to the formation. The guard sections of the magnets push the resonant region of the borehole away from the RF loop.

Figure 8:
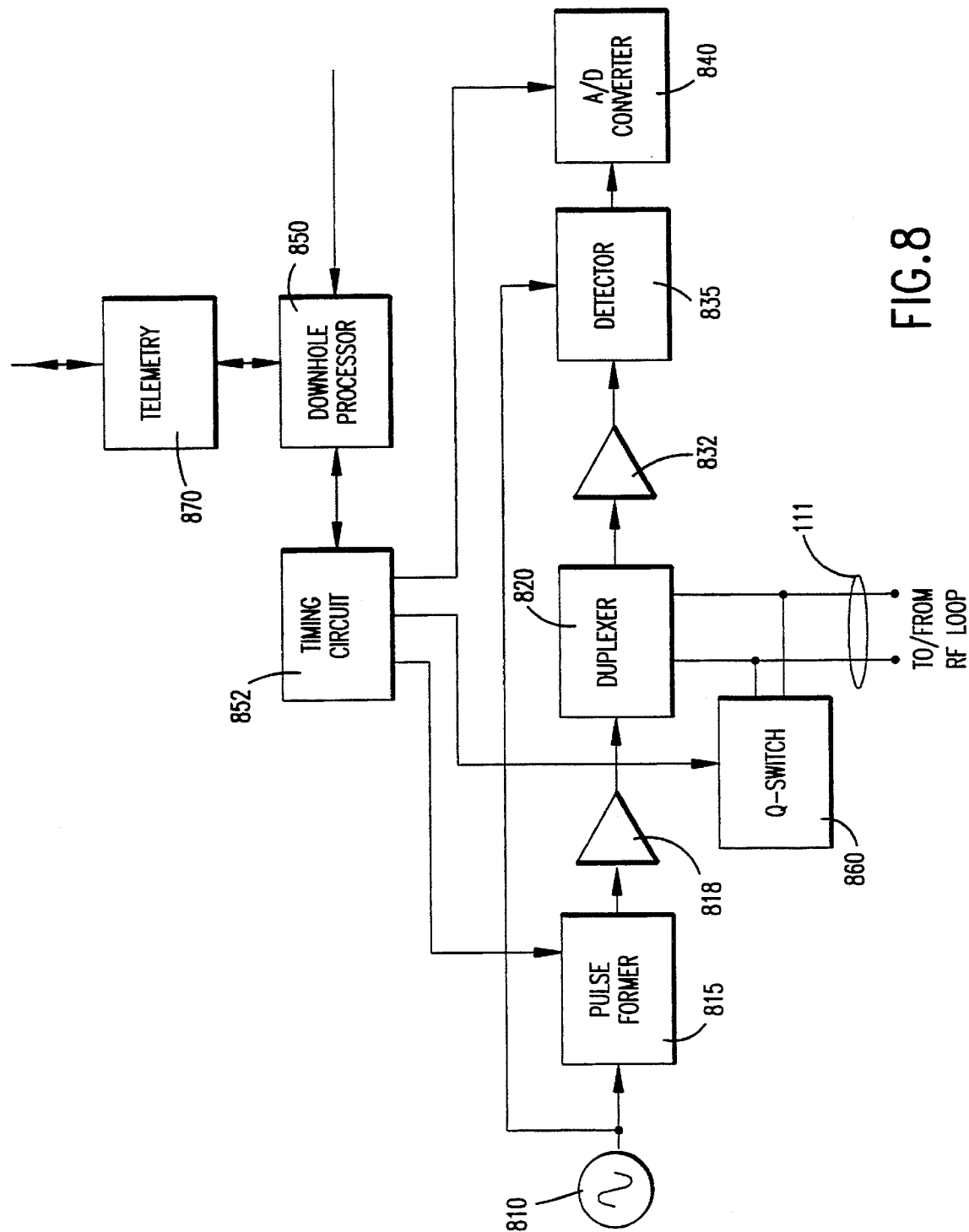
FIG. 8 is a block diagram of circuitry that can be utilized in an embodiment of the invention.

Referring to FIG. 8, there is shown a block diagram of the circuitry which, in the present embodiment, is located in region 42 of the logging device, but could be separately located in whole or in part. A transmitter section includes an oscillator, represented at 810. An output of the oscillator is coupled to a pulse former 815, the output of which is coupled to a power amplifier 818. The output of power amplifier 818 is coupled to a duplexer 820 which, in turn, is coupled to the input/output leads 111 of the RF coil. The duplexer 820 is also coupled to a receiving section that includes an amplifier 832, a phase sensitive detector 835, which also receives the oscillator output, and an analog-to-digital converter 840. The output of analog-to-digital converter 840 is coupled to a downhole processor 850, which may typically be a digital processor with associated memory, timing, and input/output circuitry. Timing circuitry is also separately represented at 852, and is coupled with pulse former 815, duplexer 820, and analog-to-digital converter 840. A Q-switch 860 is provided, and also receives timing information from timing circuit 852. Telemetry circuity 870 is conventionally provided for communicating with the earth's surface.

As known in the art, the nuclear magnetic resonance circuitry can operate in three modes: transmitting, damping, and receiving. Reference can be made, for example, to U.S. Pat. Nos. 4,933,638, 5,055,787, and 5,055,788. As described in the referenced patents, during the transmitting mode, the transmitter section generates relatively large RF power of the order of 1 kilowatt at a frequency of the order of 1 MHz for a short precisely timed period, shut off this current very quickly, within about 10 microseconds, and then isolate any signals or noise of the power circuits from coupling with detection circuitry. The system operates with a high Q, which can result in undesirable ringing. The Q-switch 860 is provided to reduce this problem. The Q switch closes a circuit at the appropriate time, which changes the impedance seen by conductors 111 so that the system is critically damped, and ringing energy is quickly dissipated. The duplexer 820 protects the receiver section from high power pulses during the transmitting and damping modes. During the receiving mode the duplexer couples the RF loop antenna to the receiver amplifier 832. The amplified signal is coupled to phase sensitive detector 835, which also receives a reference signal from oscillator 810 that controls the frequency of sensitivity of the detector 835. The detected signals is converted to digital form by circuit 840, and coupled to processor 850. Ultimate transmission to the earth's surface for further known processing is implemented by circuitry 870. Reference can be made to the above noted U.S. Pat. Nos. 4,933,638, 5,055,787, and 5,055,788 for further details of circuitry and operation.

Figure 9:
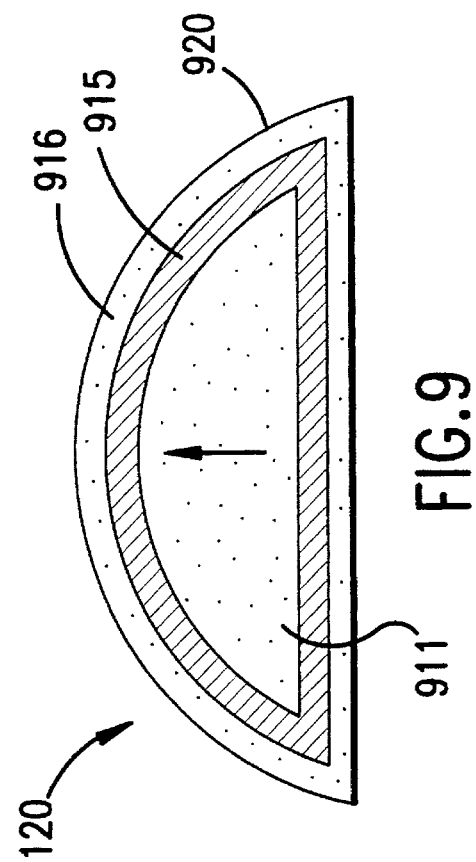
FIG. 9 is a cross-sectional view through a layered magnet casing, in accordance with an embodiment of the invention.

In an embodiment hereof, the magnet casings are layered structures that are advantageous in providing highly conductive current paths and in also reducing induced ultrasonic vibrations that can cause spurious electronic signals in the RF output. FIG. 9 shows a horizontal cross section through one of the magnet assemblies, 120. In the illustrated embodiment, the magnet material 911 comprises a rare-earth magnet material such as Sm-Co, contained within a structural casing 915 formed of a non-magnetic material, such as the metal titanium or monel. A rubber layer 916 covers the structural casing 915, and a conductive metal foil 920, such as a copper foil, covers the rubber layer.

The copper foil can carry the RF current. Because of the skin effect, RF current flows on the outer surfaces of conductors. For example, at 1 Mhz the skin depth in a copper conductor is 0.065 mm. Therefore, a copper foil can sufficiently carry the RF current. The layer of rubber between the copper foil and the structural magnet casing is useful in preventing the RF-indicated forces on the copper foil from setting up ultrasonic reverberations in the magnet or in the magnet cases 915. The copper foil itself is too thin to support ultrasonic resonances. In this regard, reference can be made to U.S. Pat. No. 5,153,514.

The invention has been described with reference to a particular preferred embodiment, but variations within the spirit and scope of the invention will occur to those skilled in the art. For example, it will be understood that other suitable materials or circuit arrangements could alternatively be employed.

I claim:

1. Apparatus for measuring a nuclear magnetic resonance property of formations surrounding an earth borehole, comprising:

a logging device moveable through the borehole;

first and second elongated magnets having parallel axes of elongation generally parallel to the axis of the borehole and being disposed in said logging device in side-by-side spaced-apart arrangement;

an RF current loop disposed in the region between said magnets;

means for coupling RF energy to said RF current loop; and means for detecting RF signals induced in said RF current loop.

2. Apparatus as defined by claim 1, wherein said elongated magnets are elongated permanent magnets.

3. Apparatus as defined by claim 2, wherein said magnets are each in the shape of a segment of a cylinder.

4. Apparatus as described by claim 2, wherein said magnets have respective casings with electrically conductive surfaces thereon, and wherein said RF current loop includes at least a portion of the conductive surfaces of said magnet casings.

5. Apparatus as described by claim 3, wherein said magnets have respective casings with electrically conductive surfaces thereon, and wherein said RF current loop includes at least a portion of the conductive surfaces of said magnet casings.

6. Apparatus as defined by claim 4, wherein said RF current loop further includes a conductor coupled between conductive surfaces of respective magnet casing surfaces.

7. Apparatus as defined by claim 5, wherein said RF current loop further includes a conductor coupled between conductive surfaces of respective magnet casing surfaces.

8. Apparatus as defined by claim 6, wherein said RF current loop further includes at least one capacitor coupled between conductive surfaces of respective magnet casing surfaces.

9. Apparatus as defined by claim 7, wherein said RF current loop further includes at least one capacitor coupled between conductive surfaces of respective magnet casing surfaces.

10. Apparatus as defined by claim 2, wherein said permanent magnets extend longitudinally beyond both longitudinal extremes of said RF current loop.

11. Apparatus as defined by claim 4, wherein said permanent magnets extend longitudinally beyond both longitudinal extremes of said RF current loop.

12. Apparatus as defined by claim 5, wherein said permanent magnets extend longitudinally beyond both longitudinal extremes of said RF current loop.

13. Apparatus as defined by claim 2, wherein said permanent magnets are rare-earth magnets.

14. Apparatus as defined by claim 4, wherein said permanent magnets are rare-earth magnets.

15. Apparatus as defined by claim 4, wherein said electrically conductive surfaces comprise copper sheets.

16. Apparatus as defined by claim 2, wherein said permanent magnets are magnetized in a direction perpendicular to their longitudinal direction, and said RF loop is oriented to produce magnetic field lines that are orthogonal to static magnetic field lines produced by said permanent magnets.

17. Apparatus as defined by claim 4, wherein said permanent magnets are magnetized in a direction perpendicular to their longitudinal direction, and said RF loop is oriented to produce magnetic field lines that are orthogonal to static magnetic field lines produced by said permanent magnets.

18. Apparatus as defined by claim 2, wherein said magnets are magnetized in a direction perpendicular to their longitudinal direction and perpendicular to the radial direction of the gap between the magnets.

* * * * *